US012652753B2

(12) United States Patent
Sapozhnikov et al.

(10) Patent No.: US 12,652,753 B2
(45) Date of Patent: Jun. 9, 2026

(54) BALANCING LOSS ACROSS ALL PORTS ON PRINTED CIRCUIT BOARD TRACES

(71) Applicant: Cisco Technology, Inc., San Jose, CA (US)

(72) Inventors: Mike Sapozhnikov, San Jose, CA (US); Joel Richard Goergen, Soulsbyville, CA (US); David Nozadze, San Jose, CA (US); Amendra Koul, San Francisco, CA (US); Upen Reddy Kareti, Union City, CA (US); Sayed Ashraf Mamun, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 200 days.

(21) Appl. No.: 18/394,194

(22) Filed: Dec. 22, 2023

(65) Prior Publication Data

US 2025/0212319 A1 Jun. 26, 2025

(51) Int. Cl.
*H05K 1/02* (2006.01)
(52) U.S. Cl.
CPC .................................. *H05K 1/0266* (2013.01)
(58) Field of Classification Search
CPC .... H05K 1/0266; H05K 1/0245; H05K 1/024; H05K 2201/0187
See application file for complete search history.

(56) References Cited

U.S. PATENT DOCUMENTS

| | | | |
|---|---|---|---|
| 10,735,039 B1 | 8/2020 | Goergen et al. | |
| 11,425,821 B2 | 8/2022 | Koul et al. | |
| 11,606,152 B2 | 3/2023 | Koul et al. | |
| 2004/0000963 A1* | 1/2004 | Killen | H01P 5/02 333/35 |
| 2014/0054066 A1 | 2/2014 | Yu et al. | |
| 2016/0120018 A1 | 4/2016 | Chang et al. | |
| 2021/0227683 A1* | 7/2021 | Rowlands | H05K 1/025 |
| 2021/0382967 A1 | 12/2021 | Goergen et al. | |
| 2022/0240366 A1* | 7/2022 | Chandra | H05K 1/024 |
| 2023/0031615 A1 | 2/2023 | Farkas et al. | |

* cited by examiner

*Primary Examiner* — Timothy J Thompson
*Assistant Examiner* — Amol H Patel

(74) *Attorney, Agent, or Firm* — Edell, Shapiro & Finnan, LLC

(57) ABSTRACT

In some aspects, the techniques described herein relate to a printed circuit board, comprising a layer, a first trace coupled to the layer and carrying a first signal; a second trace coupled to the layer and carrying a second signal; and a loss introducing feature that creates an additional signal loss in one of the first trace or the second trace, wherein the additional signal loss balances a first signal loss and a second signal loss.

20 Claims, 10 Drawing Sheets

FIG.3

BALANCING LOSS ACROSS ALL PORTS ON PRINTED CIRCUIT BOARD TRACES

TECHNICAL FIELD

The present disclosure relates to circuit boards and, more particularly, to circuit boards that balance losses across multiple ports of the circuit boards.

BACKGROUND

Electrical signals may be transmitted on a transmission line of a printed circuit board (PCB). The transmission line may be a differential pair of traces. Electronic devices utilize circuit boards or PCBs, which have various electrical components or devices mounted thereon. The electrical components are connected together using traces that are mounted or coupled to a layer of the circuit board. Circuit boards have one or more layers that are formed of a material with dielectric properties, such as a resin material or a glass material. Differential traces are used to route high data rate bitstreams, and the signals carried by the differential traces are impacted by the dielectric properties of the material or materials to which the traces are adjacent.

For a PCB, ethernet standards specify a maximum loss on chip-to-module (C2M) channels. A big variation in losses in C2M channels occurs due to the breakout from application-specific integrated circuits (ASICs), and also due to the location of front panel ports on the PCB. This loss also occurs in chip-to-chip (C2C) and other via BP channels. This signal loss is expected because signal loss is length dependent in transmission lines when the material is the same for various differential pairs. The variation in losses causes an imbalance per port in Serializer-Deserializer (SerDes) equalization parameters. In some cases, it is not possible to program (SerDes) values per differential pair to overcome the loss variations. This inability to address the problem successfully via programming reduces the efficiency or capability to achieve the best bit error rate (BER) performance on each differential pair. As a result, a PCB designer is forced to employ undesired routing practices, such as serpentine routing, that may add skew and other impairments to a channel. Such impairments do not result in the best tradeoffs that are required to compensate for the loss for the differential pair.

BRIEF DESCRIPTION OF THE DRAWINGS

FIG. 3 is a plan view of another example embodiment of a PCB, according to the techniques disclosed herein.

DETAILED DESCRIPTION

Overview

Figure 1:
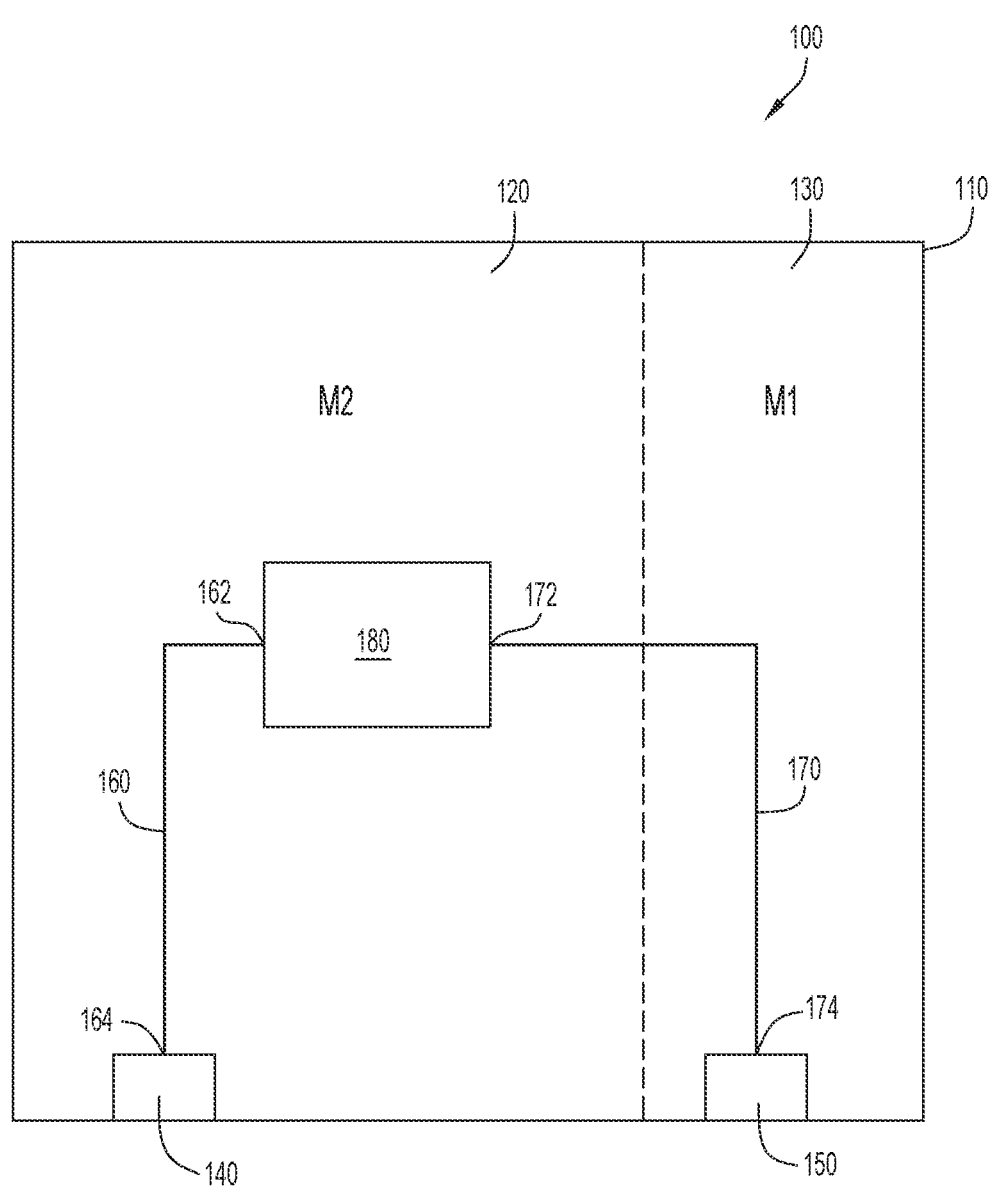
FIG. 1 is a schematic diagram of a PCB that includes several components according to the techniques disclosed herein, according to an example embodiment.

A signal loss in a trace of a circuit board can be caused by one or more of the following factors: dielectric losses, conductor resistance, and radiation losses. Signal losses in a PCB trace may result in a lowered quality of the signal, a slower transmission speed, and a reduced performance of the electronic device. The techniques described herein relate to introducing signal losses or balancing signal losses by introducing signal losses by controlling or creating dielectric losses.

In some aspects, the techniques described herein relate to a printed circuit board, comprising: a layer; a first trace coupled to the layer and carrying a first signal, the first trace having a first end and a second end opposite the first end, the first signal in the first trace encountering a first signal loss between the first end and the second end; a second trace coupled to the layer and carrying a second signal, the second trace having a third end and a fourth end opposite the third end, the second signal in the second trace encountering a second signal loss between the third end and the fourth end; and a loss introducing feature that creates an additional signal loss in one of the first trace or the second trace, wherein the additional signal loss balances the first signal loss and the second signal loss.

In some aspects, the techniques described herein relate to a printed circuit board, comprising: a layer having a first portion and a second portion, the first portion being formed of a first material, the second portion being formed of a second material, the second material having different dissipation properties from the first material; a first trace coupled to the layer and carrying a first signal, the first trace having a first end and a second end opposite the first end, the first trace being proximate to the first material and having a first length; and a second trace coupled to the layer and carrying a second signal, the second trace having a third end and a fourth end opposite the third end, the second trace being proximate to the second material and having a second length, the second length being greater than the first length, wherein the first material induces a first signal loss in the first trace, the second material induces a second signal loss in the second trace, and the first material and the second material create signal losses in the first trace and in the second trace respectively such that signal losses in the first trace and in the second trace are substantially the same.

In some aspects, the techniques described herein relate to a printed circuit board, comprising: a layer having a loss balancing feature, the loss balancing feature including a first portion of the layer being formed of a first resin material having first dissipation properties and a second portion of the layer being formed of a second resin material having second dissipation properties, the second dissipation properties being different from the first dissipation properties; a first trace coupled to the layer and in contact with the first portion, the first trace having a first length and extending from a first end to a second end, the first trace carrying a first signal that has a first strength at the first end and a second strength at the second end; and a second trace coupled to the layer and in contact with the second portion, the second trace having a second length and extending from a third end to a fourth end, the second trace carrying a second signal that has a third strength at the third end and a fourth strength at the fourth end, wherein the second length is greater than the first length, the first strength is substantially the same as the third strength, and the second strength is substantially the same as the fourth strength due to the loss balancing feature of the layer causing a signal loss in the first trace to be substantially the same as a signal loss in the second trace.

Example Embodiments

The techniques described herein relate to various ways to balance signal loss across multiple ports on PCB traces. Traces from a chip, such as an ASIC, to ports on a PCB are not the same length. Sometimes, the routing of traces require the traces to meander and not be routed linearly. The different routing paths of traces result in different lengths of traces. As the signal frequency in traces increases, such as being 50 GHz and above, a serpentine routing that adds length to the trace has a negative impact to the carried signal.

Dielectric materials that are used for a layer in a circuit board have various characteristics or properties. In particular, the dielectric materials have dielectric loss characteristics, which include a dielectric constant (DK) and a dissipation factor (DF), which determine how much impact the dielectric material will have on a signal in a trace coupled to the dielectric material. When it is desired to minimize the signal loss in a trace to maintain a particular signal integrity or level, a low dielectric material can be used, which would have a low DK and a low DF. If it is desired to slightly increase the signal loss in a trace, such as in an implementation in which balancing of losses is desired between a pair of traces, a slightly higher dielectric material can be used, with a higher DK and a higher DF, adjacent to the trace in which the signal loss increase is desired. Balancing losses in traces involves adding a drop to one of the signals, which in other words, is introducing a signal loss.

PCB transmission line geometry is different than twin axial (twinax) cable transmission line geometry. The loss distribution of a PCB transmission line from any of a conductor, an oxide treatment, or a resin material (dielectric losses) are dependent on the frequency of the signal. The percentage contribution of each of those factors at each frequency point is very different depending the DK/DF properties of the resin and glass (fiber weave) material, the geometry of the transmission line design, and the process by which the trace was made, such as particular etch treatment used on the metal. The combination of design parameters determine the total loss of a trace the differential pair in the PCB.

In different technical aspects disclosed herein, signal losses can be introduced to achieve particular signal loss results, such as balancing loss in a differential pair of traces. In various implementations and embodiments, signal losses can be introduced several different ways. In one implementation, a signal loss can be introduced using different resin materials or glass materials in a circuit board layer, with the different resin materials having different DF/DK properties. In another implementation, a signal loss can be introduced by arranging different resin materials having different DF/DK properties in different areas or in particular patterns within a layer of the circuit board. The different resin materials may be placed according to the particular locations and paths of the differential traces. For example, in one embodiment, the different resin or glass materials can be arranged in stripes. In another embodiment, the different resin or glass materials can be arranged in a checkerboard pattern or configuration.

In one implementation, alignment markers, such as colored stripes or shapes, can be provided on the surface of the circuit board layer so that the different resin material portions are marked. The markers assists with alignment during the manufacturing process, including the placement of traces by knowing the relative properties of the different resin materials.

In one implementation, a glass PCB may be used, which is made from a combination of glass fibers and epoxy resin. In a glass PCB, different glass materials with different DF properties are arranged in a desired pattern to adjust for loss due to the etching performed to create a circuit pattern.

As mentioned above, to introduce a signal loss, a variety of techniques can be used. Different DF materials with similar coefficient of thermal expansion (CTE) properties can be used in a board. Alternatively, conductor geometry variations can be utilized. Also, selective glass striping with different DF glass materials can be used to achieve a particular loss. Alternatively, regional striping based on the design where loss modifications are desired can be used.

With regard to PCB traces, the losses may be introduced by using resin with different dielectric DF properties, examples of which are described below. The resin can be used in a laminate or on a portion of a glass sheet. While some of the example embodiments disclosed herein are configured in stripes or in a checkerboard arrangement, in different embodiments, the arrangements can vary.

Turning to FIG. 1, an example embodiment of a PCB according to the techniques disclosed herein is illustrated. In this embodiment, a PCB 100 has a layer 110, which has a surface. Coupled to the layer 110 is an integrated circuit chip 180, which can be any type of processing component, such as an ASIC. The PCB 100 includes traces 160 and 170, each of which is coupled to the layer 110. Trace 160 includes an end 162 connected to chip 180 and an opposite end 164 connected to an electronic component 140, which can be a front panel port. Similarly, trace 170 includes an end 172 connected to chip 180 and an opposite end 174 connected to another electronic component 150, which can be a front panel port.

Trace 160 carries a signal that has or encounters a signal loss from end 162 of the trace 160 to end 164 of the trace 160. Similarly, trace 170 carries a signal that has or encounters a signal loss from end 172 of the trace 170 to end 174 of the trace 170. The signal at end 162 and the signal at end 172, both of which are connected to the chip 180, are the same.

In this embodiment, the length of trace 160 is different than the length of trace 170. In particular, trace 170 is longer than trace 160. When considering only the larger length of trace 170, the signal integrity in trace 170 is impacted more by the length of trace 170 than the signal integrity in trace 160 is by the length of trace 160. As it is desirable to balance the signal losses between traces 160 and 170, a signal loss in trace 160 is to be introduced.

In this embodiment, a dielectrically caused signal loss is created. Layer 110 is formed from two different materials M1 and M2 that are shown in a simple arrangement as portions 120 and 130. The different materials for portions 120 and 130 have different dielectric properties, and as a result, affect the signals in traces 160 and 170 that are coupled to or proximate the material portions 120 and 130. Material M1 has dielectric properties that are lower than the dielectric properties of material M2. As a result, losses introduced in the signals in traces 160 and 170 can be controlled or managed by the choices of materials M1 and M2 used for portions 120 and 130. The use of different dielectric materials M1 and M2 can be referred to as a loss balancing feature or a loss introducing feature.

Each of the traces 160 and 170 encounters a signal loss due to its routing path and the length of the trace. By utilizing different dielectric materials adjacent to the traces, additional losses can be introduced. For example, if the signal loss in trace 160 is larger than the signal loss in trace 170 due to their lengths, an additional signal loss can be introduced in trace 170 by placing trace 170 adjacent to a material in the circuit board layer that has higher dielectric properties than the material to which trace 160 is adjacent. As a result, a sum of the signal loss in trace 170 due to its length and the additional signal loss in trace 170 due to the difference in the dielectric properties of the adjacent material is substantially the same as the sum of the signal loss in trace 160. Accordingly, the signal losses in traces 160 and 170 are balanced. When the signal losses are the same or substantially the same, and the signals start with the same strength and integrity, then the signals at ends 164 and 174 are balanced and have the same strength and integrity.

The terms "approximately" and "substantially" are used herein relative to the term "same" with respect to the strength and integrity of signals in a differential pair of traces and the balanced losses between them. While balanced signal losses in a pair of traces may be referred to herein as the same, it is to be appreciated that the terms "approximately" and "substantially" are intended to cover very minor deviations in the signal losses that are not absolutely exactly the same. In particular, the terms "approximately" and "substantially" are intended to cover such minor deviations that are within 5% of being exactly the same.

Figure 2:
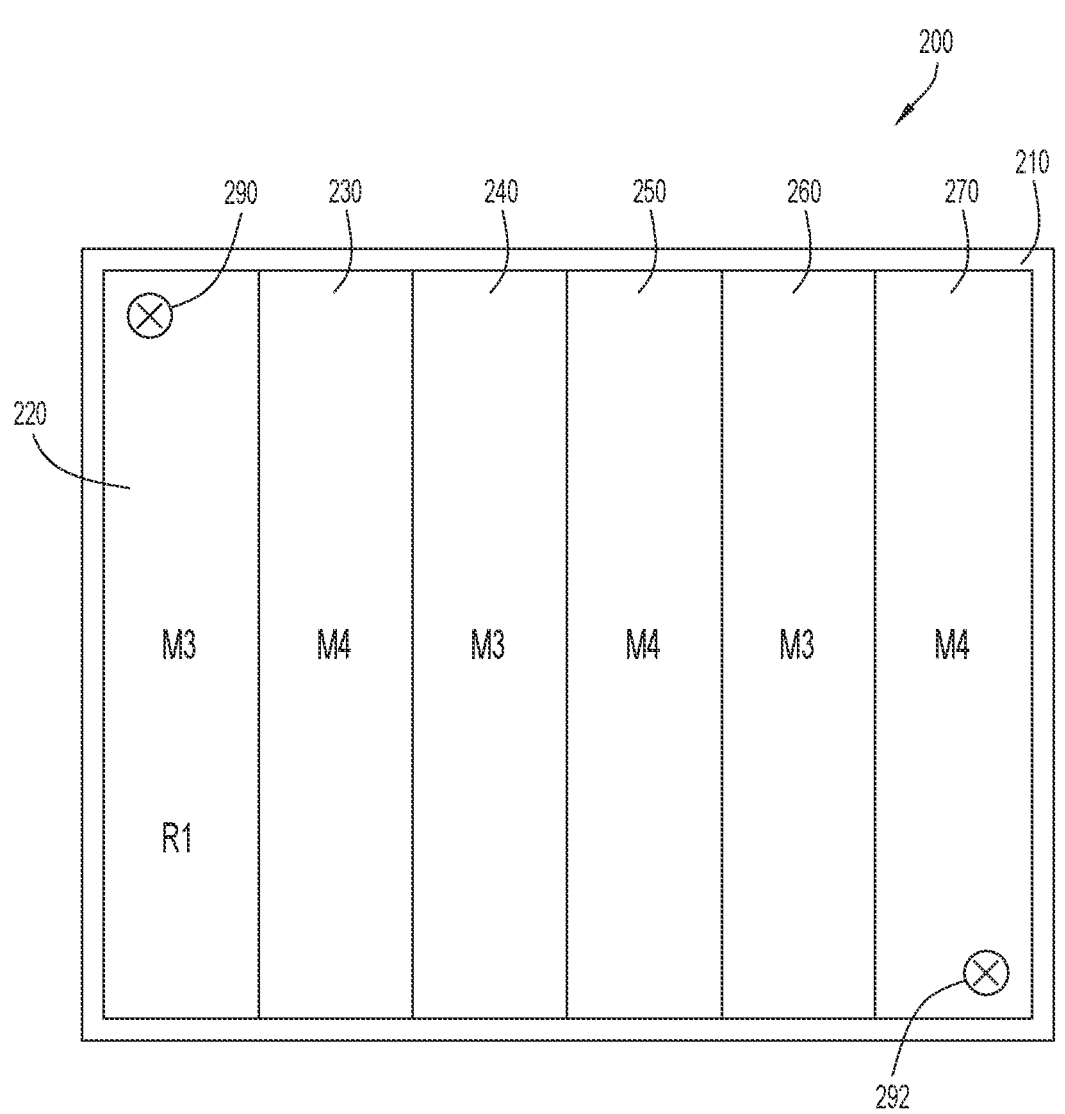
FIG. 2 is a plan view of another example embodiment of a PCB, according to the techniques disclosed herein.

Turning to FIG. 2, an alternative embodiment of a circuit board according to the techniques described herein is illustrated. The circuit board 200 includes a layer 210 that has several different portions. In this embodiment, the layer 210 is a sheet of glass that includes portions made of different materials. The different glass materials, M3 and M4, are arranged in alternating stripes across the layer 210. Portions 220, 240, and 260 are made of material M3, and portions 230, 250, and 270 are made of material M4.

In one example embodiment, material M3 may have a dielectric constant (DK) of 4.0 and material M4 may have a DK of 1.5. In another example embodiment, material M3 may have a DF that is higher than the DF of material M4. In both embodiments, each of the traces can be routed to be proximate or coupled to one or more of the portions 220, 230, 240, 250, 260, and 270 of layer 210 to achieve a desired signal loss level in the trace. As mentioned above, signal losses can be introduced to balance the signal losses between traces.

In addition, a layer of resin RI is applied onto the material M3 of portion 220. Layer 210 also includes a pair of fiducials 290 and 292 that are located in positions to facilitate locating steps in the manufacturing of the circuit board 200.

Figure 3:
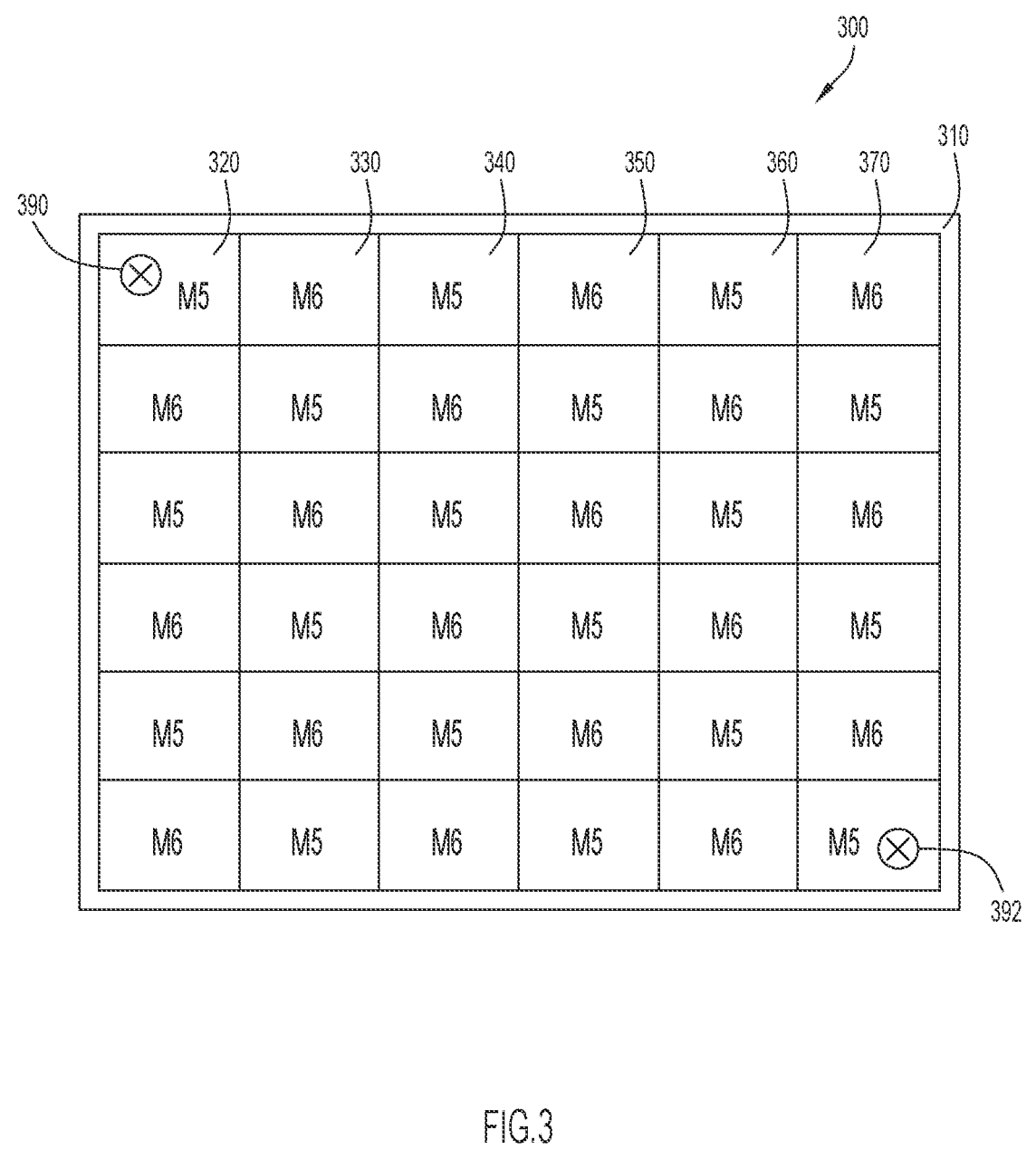

Turning to FIG. 3, an alternative embodiment of a circuit board according to the techniques described herein is illustrated. The circuit board 300 includes a layer 310 that has several different portions. In this embodiment, the layer 310 is a sheet of glass that includes portions made of different materials. The different materials, M5 and M6, are arranged in a checkerboard pattern across the layer 210. Portions 320, 330, 340, 350, 360, and 370 are made of alternating areas of material M5 and material M6. As discussed above relative to FIG. 2, material M5 may have a dielectric constant (DK) of 4.0 and material M6 may have a DK of 1.5. In another example embodiment, material M5 may have a DF that is higher than the DF of material M6. Each of the traces coupled to layer 310 is routed to be proximate or coupled to one or more of the portions 320, 330, 340, 350, 360, and 370 of layer 310 to achieve a desired signal loss level in the trace. As mentioned above, signal losses can be introduced to balance the signal losses between traces. Layer 310 also includes a pair of fiducials 390 and 392 located at opposite corners of the layer 310.

Figure 4:
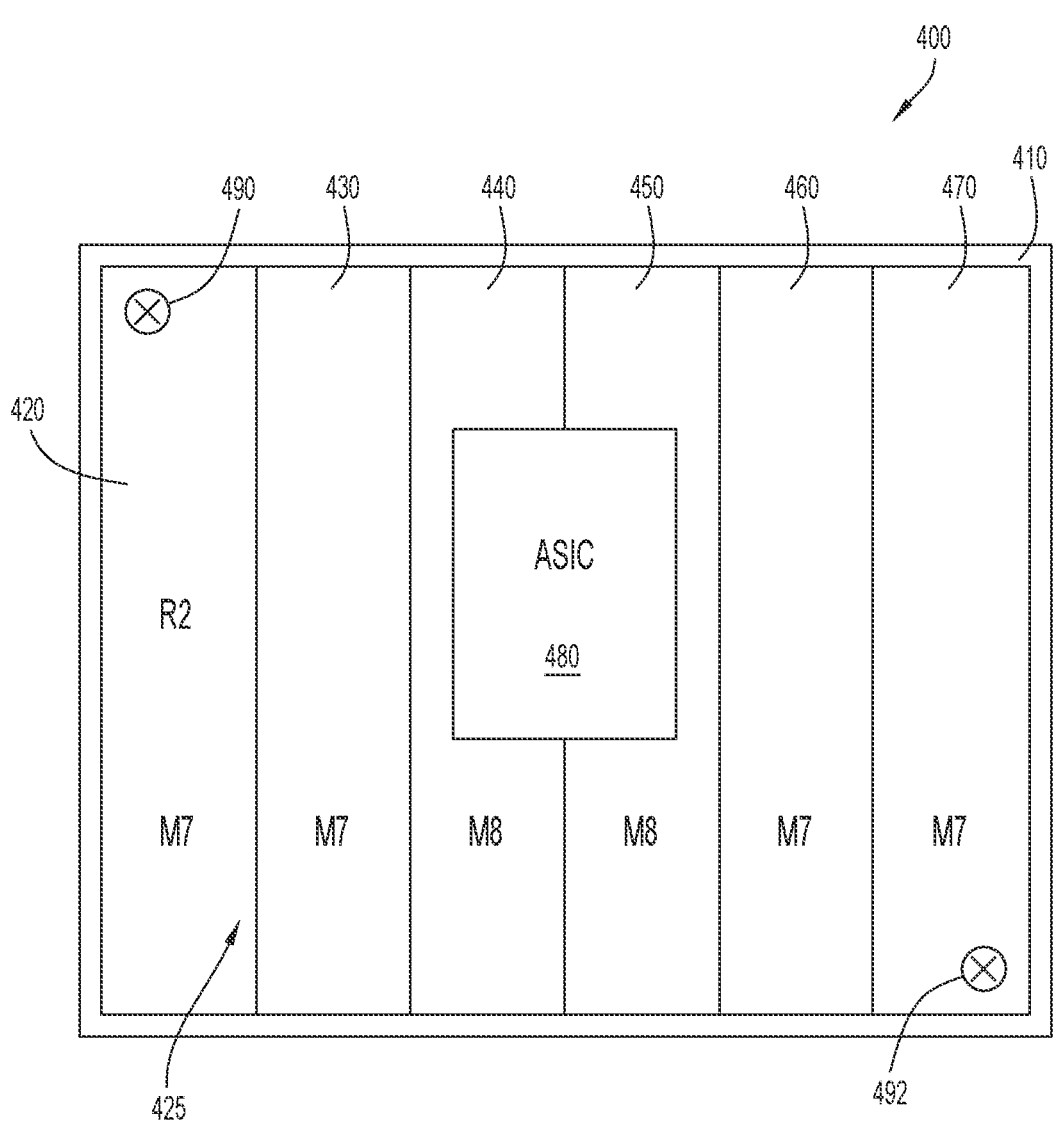
FIG. 4 is a plan view of another example embodiment of a PCB, according to the techniques disclosed herein.

Turning to FIG. 4, another alternative embodiment of a circuit board according to the techniques described herein is illustrated. The circuit board 400 is a layer 410 that is a glass sheet. In this embodiment, different resin materials that have different loss profiles with similar or different glass types can be used to adjust loss to mitigate the variations in physical etching due to the space constraints on the circuit board 400.

As shown in FIG. 4, the different materials M7 and M8 can be arranged in a striped pattern. However, the materials M7 and M8 are arranged as alternating stripes. As a result, portions 440 and 450, formed of material M8, are located side by side, and have an ASIC 480 coupled to them. Material M7, which may have lower dielectric properties (DK/DF) than material M8, are located as portions 420, 430, 460, and 470. A boundary 425 is located between adjacent portions 420 and 430. In this embodiment, traces are not routed beyond the boundary 425 and into portion 420. As a result, a majority of the signal loss is in the conductor.

The DF and DK properties of materials M7 and M8 can vary and be used as tools to adjust the losses in traces that are located proximate to portions 430, 440, 450, 460, and 470. The DF and DK properties can also be used to mitigate thru hole reflections. Fiducials 490 and 492 are also used on layer 410 to facilitate the manufacturing process. In this embodiment, a resin material is added to the upper surface of portion 420 on material M7.

Figure 5:
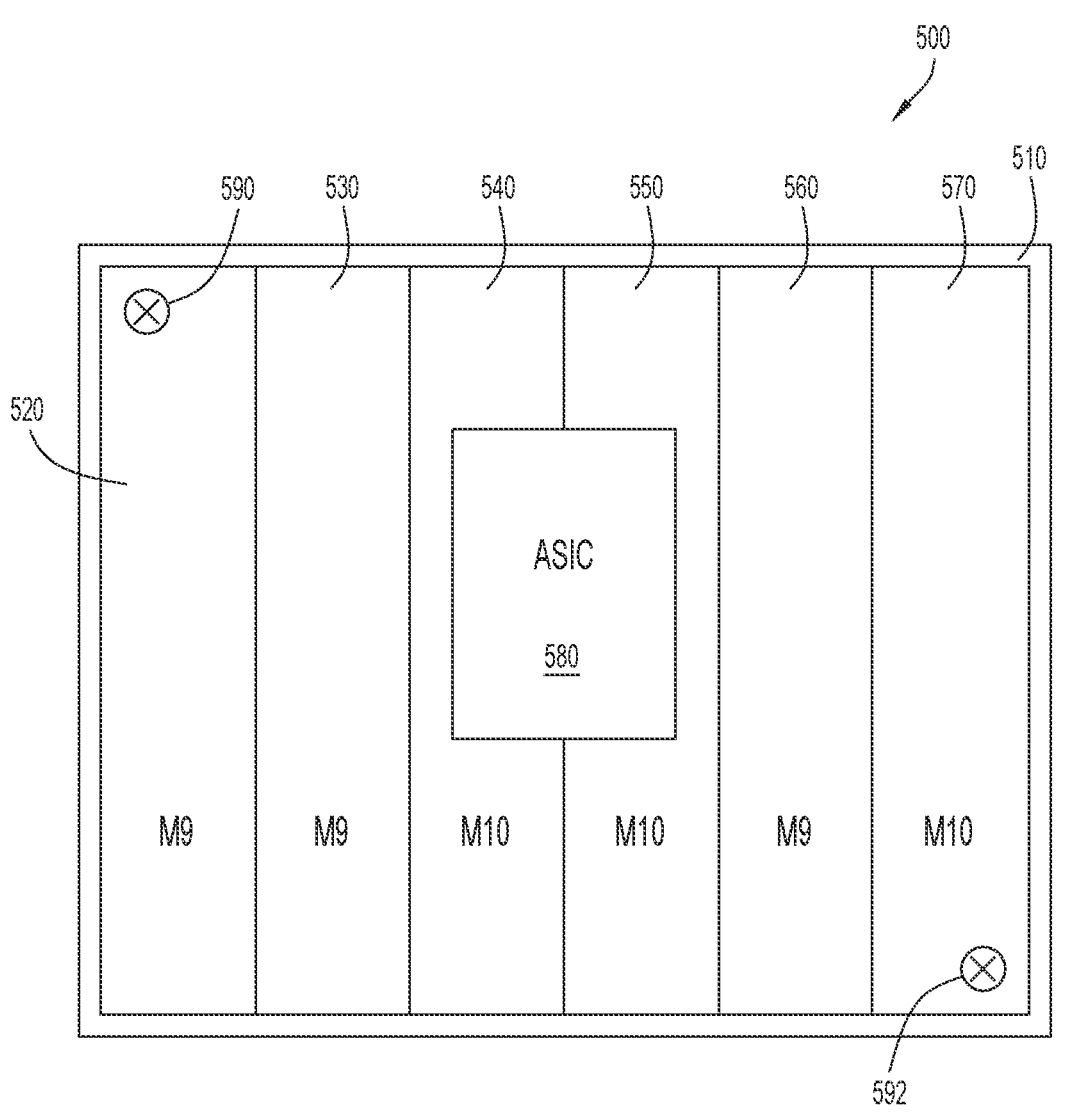
FIG. 5 is a plan view of another example embodiment of a PCB, according to the techniques disclosed herein.

Depending on the material and the geometry, glass may be a significant portion of the loss in the fiber weave epoxy construction. Turning to FIG. 5, another embodiment of a circuit board according to the techniques described herein is illustrated. In this embodiment, the circuit board 500 includes a layer 510, which is a sheet of glass material, that has an ASIC 580 mounted thereto. Portions 520, 530, and 560 of the layer 510 are formed of a material M9, which is a glass material with low dielectric properties, which results in a lower signal loss in an adjacent trace. Portions 540, 550, and 570 are formed of a material M10, which is different from material M9. Material M10 is a glass material that has higher signal loss properties than material M9, and as a result, causes slightly more signal loss in an adjacent trace as compared to the signal loss due to material M9. Layer 510 also has fiducials 590 and 592 for alignment purposes.

Figure 6:
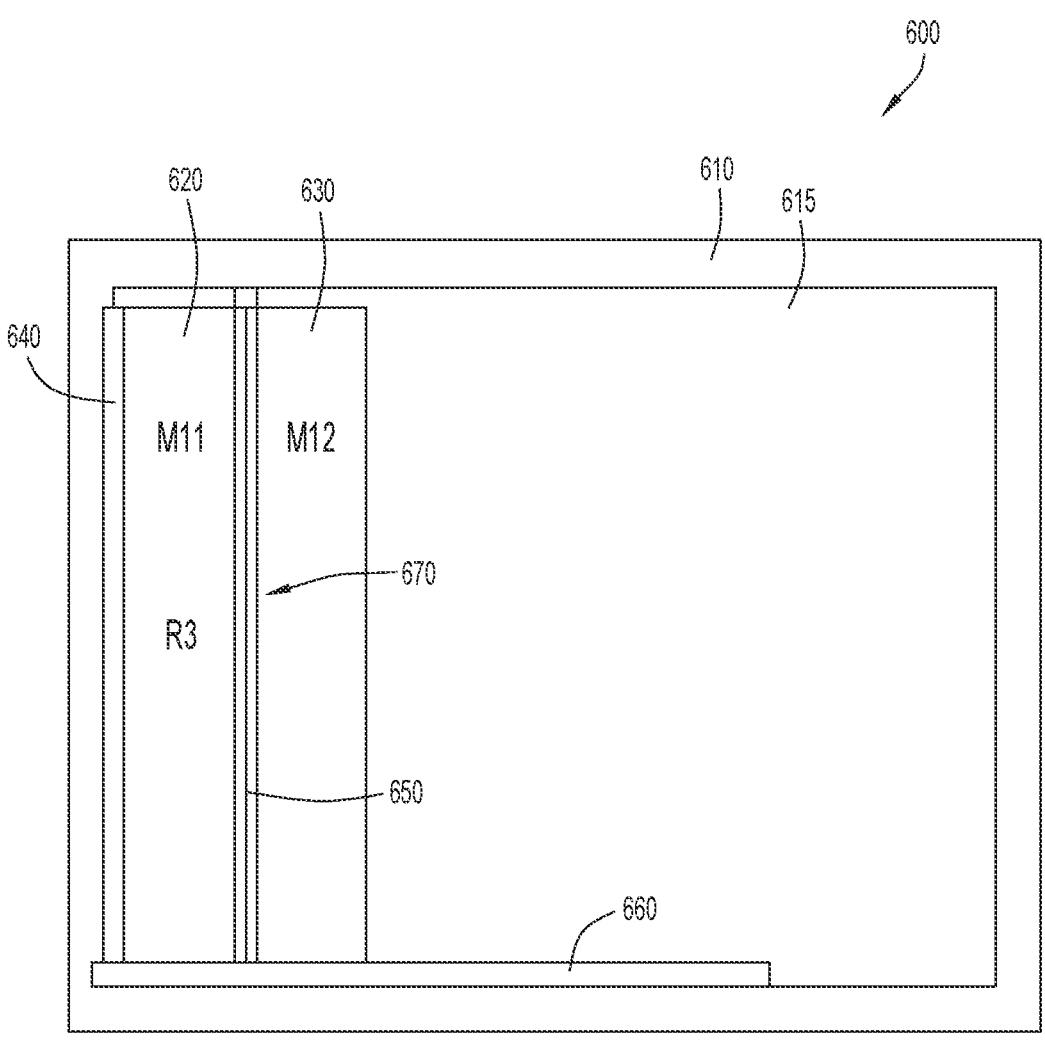
FIG. 6 is a plan view of another example embodiment of a PCB, according to the techniques disclosed herein.

Turning to FIG. 6, another embodiment of a circuit board according to the disclosed techniques is illustrated. In this embodiment, the circuit board 600 includes a glass frame 610 and an interior portion 615 surrounded by the glass frame 610. The interior portion 615 includes a portion 620 that is formed of a glass material M11 and another portion 630 that is formed of a different glass material M12. As shown, thread seams or an adhesive, such as glue, is located at joints 640, 650, and 660. There is a boundary 670 formed between the adjacent edges of portions 620 and 630. In this embodiment, a resin material, R3, is added to portion 620, and in some embodiments, the resin material R3 is added on the outer surface of portion 620.

Figure 7:
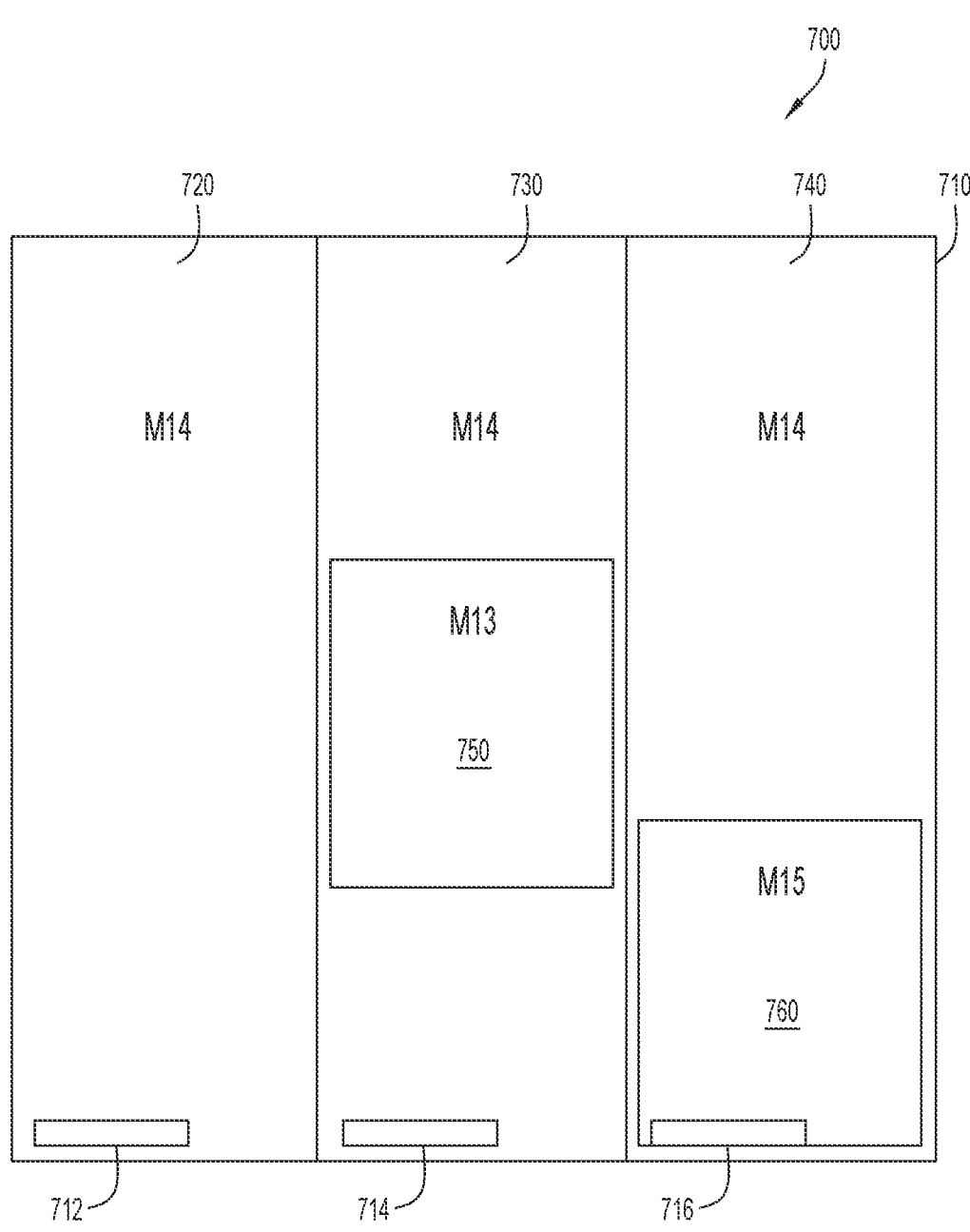
FIG. 7 is a plan view of another example embodiment of a PCB, according to the techniques disclosed herein.

An alternative embodiment of a circuit board according to the techniques described herein is illustrated in FIG. 7. In this embodiment, circuit board 700 is a glass sheet 710 that is formed of several different glass materials. The different glass materials are arranged in different stripes. One stripe is a solid stripe formed of a single glass material, and each of the other two stripes has multiple glass materials and can be referred to as mixed stripes.

Glass sheet 710 has three sections or portions that are identified by the dashed lines in FIG. 7. Portion 720 is a sold stripe that is formed of a glass material M14. Portion 730 is a mixed stripe that is formed predominantly of glass material M14, but has a portion 750 made of another glass material M13 that has different properties than glass material M14. Portion 740 is a mixed stripe that is formed predominantly of glass material M14 as well, but has a portion 760 made of another glass material M15 that has different properties than glass material M14. In addition, the properties of glass material M15 are different than the properties of glass material M13.

To distinguish and identify the different portions of glass sheet 710, and to facilitate alignment of the glass sheet 710 and traces, several markers or indicators are provided on glass sheet 710. Marker 712 is located within portion 720 and proximate to an end of the portion 720, and thus, the glass sheet 710. Similarly, marker 714 is located within portion 730. In addition, marker 716 is located within portion 740 and, in this example embodiment, located within portion 760.

In one embodiment, the markers 712, 714, and 716 can be colored stripes that are applied or coupled to the glass sheet 710. As mentioned above, the markers 712, 714, and 716 may be used for alignment of the glass sheet 710 and any traces applied to the glass sheet 710.

Figure 8:
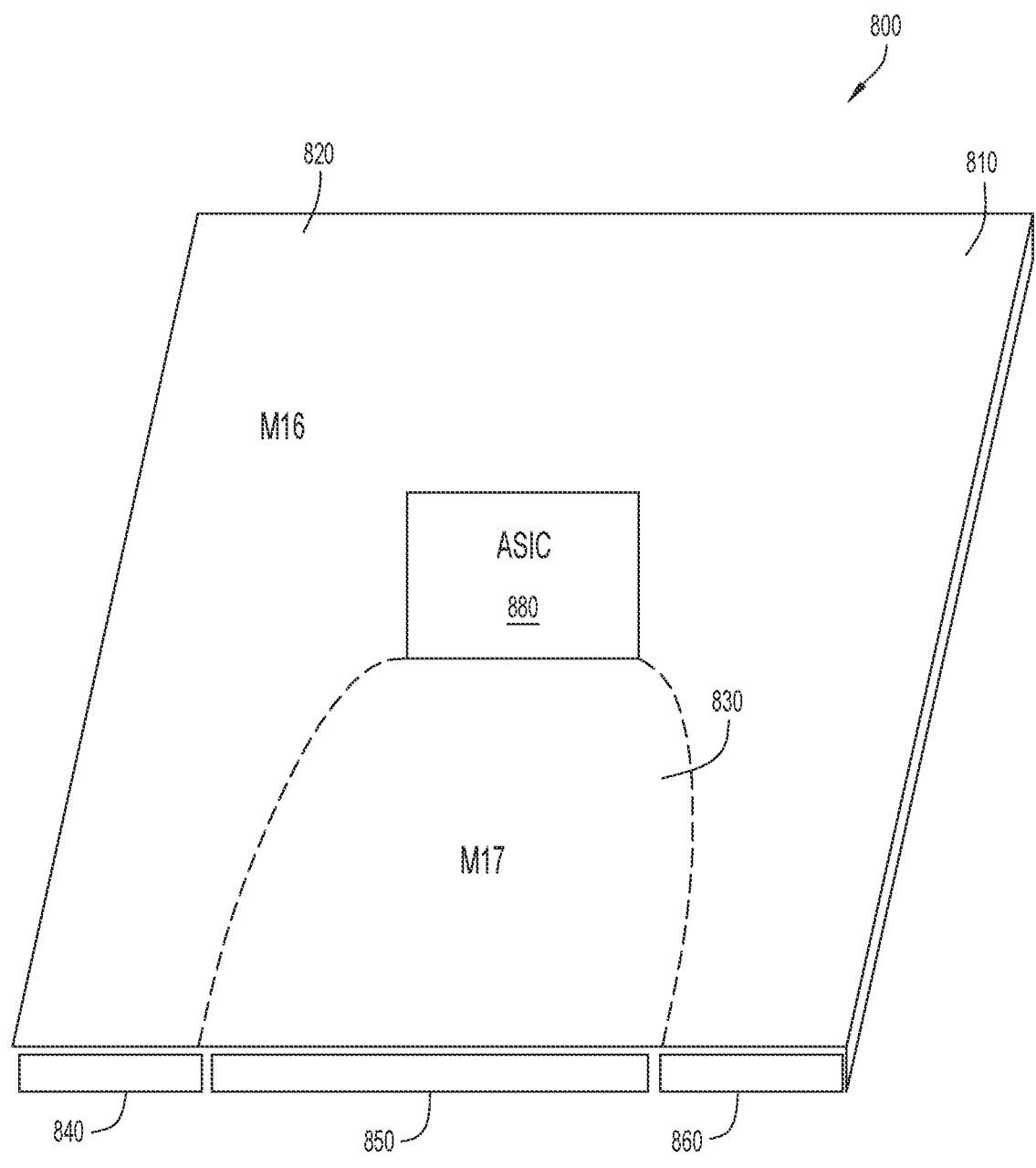
FIG. 8 is a plan view of another example embodiment of a PCB, according to the techniques disclosed herein.

Turning to FIG. 8, another example embodiment of a circuit board according to the techniques disclosed herein is shown. Ini this embodiment, the circuit board 800 is a layer 810, which is a glass sheet that has two different material portions. The layer 810 also includes an ASIC 880 mounted thereto. Portion 820 is made of a glass material M16, and portion 830 is made of a different glass material M17. The properties of each of the glass materials M16 and M17 are different from those of the other glass materials so that signal losses can be introduced and managed in traces proximate to portions 820 and 830. Notably, in this embodiment, the portions 820 and 830 are not arranged in a striped pattern. End portions 840 and 860 are the ends of the portion 820 of the layer 810 made of material M16. End portion 850 is the end of portion 830 of the layer 810 made of material M17.

Figure 9:
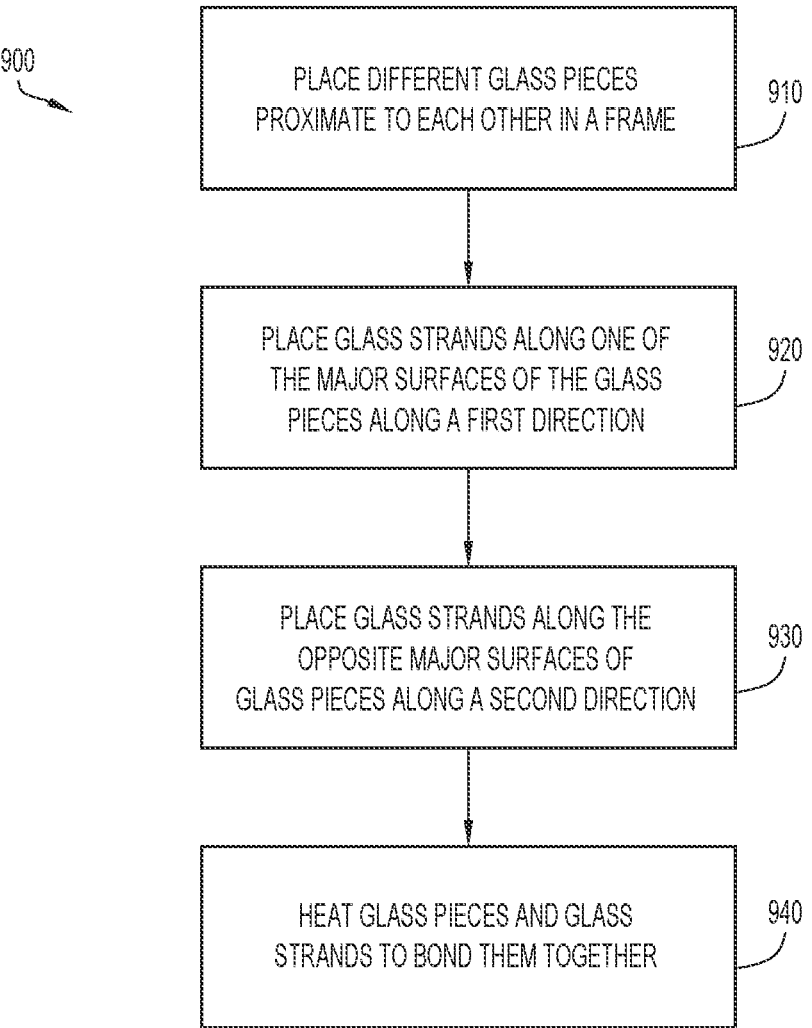
FIG. 9 is a flowchart of an example embodiment of a process for forming a layer of glass for a PCB, according to the techniques disclosed herein.
Figure 10:
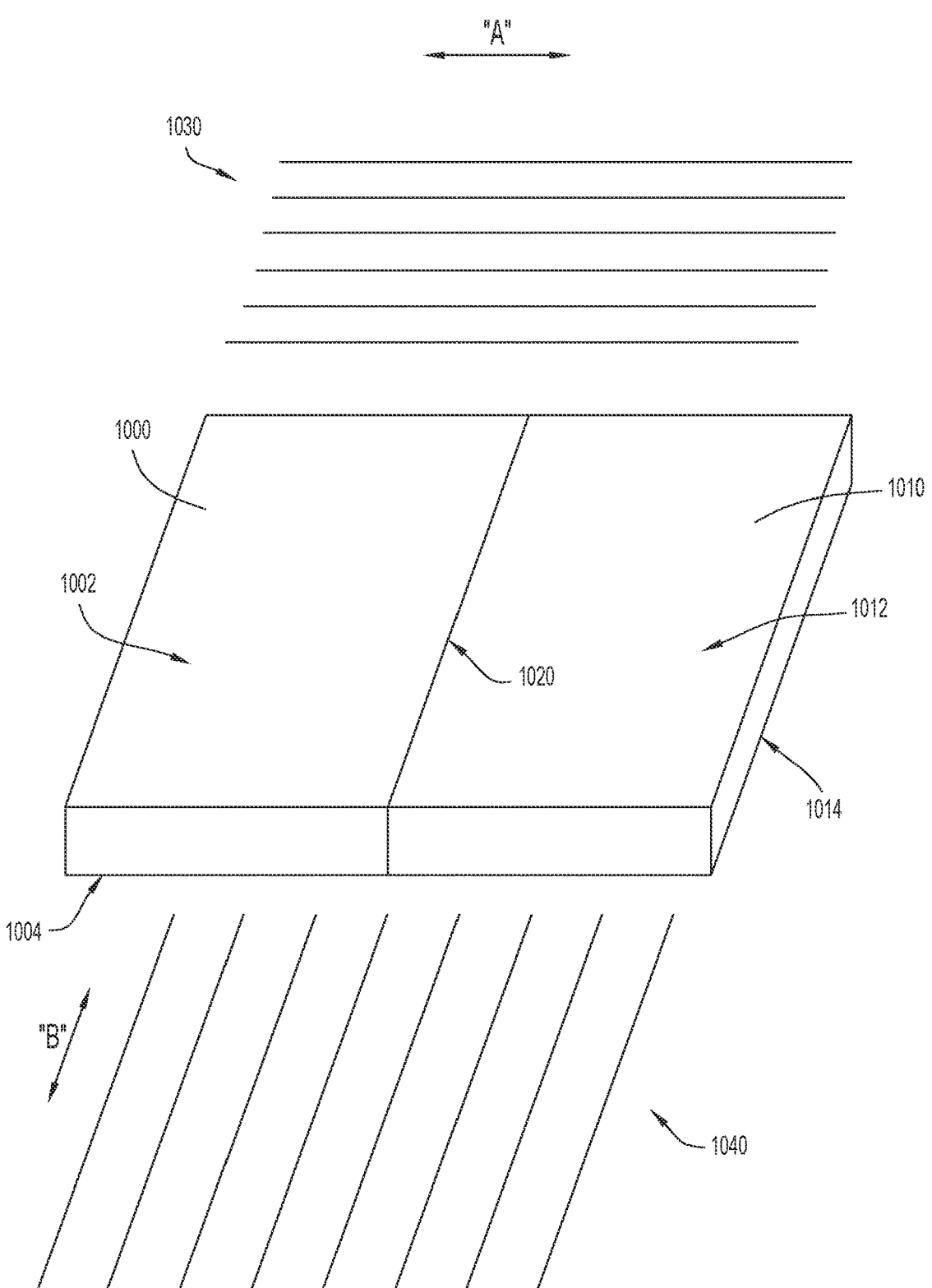
FIG. 10 is an exploded perspective view of an example embodiment of a layer of glass for a PCB, according to the techniques disclosed herein.

Referring to FIGS. 9 and 10, an example embodiment of a process and a layer of glass for a PCB that is formed by the process are illustrated. In FIG. 9, this process 900 is performed to form a glass layer that can be used in a PCB. In FIG. 10, which is described simultaneously with FIG. 9, is an exploded view of some of the components of an embodiment of a glass layer that can be formed by process 900.

When a glass layer is formed of glass materials that have different properties, the thickness of the glass materials is ideally the same. In one embodiment, a first glass piece with a first set of properties is placed adjacent to a second glass piece that has a second set of properties, at least some of which are different from the properties of the first glass piece. In one implementation, the glass pieces include resin, which reacts to the applied heat. When the glass pieces are adjacent to each other, a joint or seam is formed by them. In some instances, the heating process may result in the joint or seam not completely forming between adjacent glass pieces.

In step 910, the different glass pieces are placed proximate to each other. In one embodiment, the different glass pieces are placed proximate to each other in a frame, such as a glass frame. Referring to FIG. 10, glass piece 1000 is placed proximate to glass piece 1010. Glass piece 1010 has different properties from glass piece 1000, which may include dielectric properties. When glass pieces 1000 and 1010 are proximate to each other, a joint or seam 1020 is located at the interface of them. As mentioned above, the joint 1020 may not fully form between glass pieces 1000 and 1010.

In this embodiment, glass piece 1000 has a first major surface 1002 and a second major surface 1004 opposite to first major surface 1002. Similarly, glass piece 1010 has its own first major surface 1012 and its own second major surface 1014 opposite to surface 1012. When glass pieces 1000 and 1010 are placed proximate to each other and they have the same thickness, major surfaces 1002 and 1012 are co-planar, and major surfaces 1004 and 1014 are co-planar.

It is to be understood that while only two glass pieces are illustrated in FIG. 10, in different embodiments, more than two glass pieces can be placed side-by-side and form a glass layer. A joint or seam would be formed between each pair of adjacent glass pieces.

Returning to process 900 in FIG. 9, in step 920, several glass strands or threads are placed along one of the major surfaces of the glass pieces in a first direction. Turning to FIG. 10, glass strands or threads 1030 are placed proximate to major surfaces 1002 and 1012 along the directions of arrow "A". In one embodiment, step 920 may utilize between six to twelve glass strands. In other embodiments, the quantity of glass strands may vary.

Returning to FIG. 9, in step 930, several glass strands are placed along the major surfaces of the glass pieces that are opposite from those in step 920. In addition, the glass strands placed in step 930 are oriented along a second direction that is different from the first direction. Turning to FIG. 10, glass strands 1040 are placed proximate to major surfaces 1004 and 1014 of glass pieces 1000 and 1010, respectively. Glass strands 1040 are placed generally along the directions of arrow "B", as shown. In this embodiment, arrow "B" is oriented along a different direction than arrow "A". In one embodiment, arrow "B" may be oriented perpendicularly to arrow "A". In other embodiments, arrow "B" may be slightly off from being perpendicular to arrow "A". In one embodiment, step 930 may utilize between six to twelve glass strands. In other embodiments, the quantity of glass strands may vary.

Returning to FIG. 9, in step 940, the glass pieces 1000 and 1010 and the glass strands 1030 and 1040 are heated. The resin present on the glass pieces 1000 and 1010 is activated by the heat. The result of process 900 is a glass layer formed of multiple glass pieces with different properties. The bond between the adjacent glass pieces is strengthened by the various glass strands 1030 and 1040 that are oriented in different directions and embedded in the glass layer due to the resin.

In a circuit board design in which an ASIC routing goes to the front panel ports of the circuit board, a difference in trace lengths results in loss variations among various channels. In some new designs, a die (such as a north or south die) is used for routing, this effect is accentuated because of the additional package loss that the connection has to make. As frequencies increase, this variation in losses is likely to happen because for a circuit board, there can be a huge loss delta between a 5 GHz total loss and a 20 GHz total loss.

On top of the loss differences, there are also speed grade differences in front panel usage where a customer could plug in a 1G port and in the next port, could plug in 56G port. Apart from the physical etch differences in the routing coming from the package and the circuit board, this customer use case makes the loss delta situation worse.

By being able to introduce signal losses as desired, the ASIC can be located anywhere on a layer of a circuit board, and not only just in the center of the layer. The ASIC can be located anywhere because the impact of different lengths of traces can be overcome by utilizing different materials in various portions of the layer of a circuit board.

In summary, the advantages of the example embodiments of circuit boards according to the disclosed techniques include innovative ways to balance signal losses across the ports in a circuit board to have better BER and more predictability as there is one less variation in the circuit board design.

In some aspects, the techniques described herein relate to a printed circuit board, comprising: a layer; a first trace coupled to the layer and carrying a first signal, the first trace having a first end and a second end opposite the first end, the first signal in the first trace encountering a first signal loss between the first end and the second end; a second trace coupled to the layer and carrying a second signal, the second trace having a third end and a fourth end opposite the third end, the second signal in the second trace encountering a second signal loss between the third end and the fourth end; and a loss introducing feature that creates an additional signal loss in one of the first trace or the second trace, wherein the additional signal loss balances the first signal loss and the second signal loss.

In some aspects, the techniques described herein relate to a printed circuit board, further comprising: a chip; a first panel port; and a second panel port, wherein the first end of the first trace is connected to the chip, the second end of the first trace is connected to the first panel port, the third end of the second trace is connected to the chip, and the fourth end of the second trace is connected to the second panel port.

In some aspects, the techniques described herein relate to a loss introducing feature that creates the additional signal loss in the second trace, and a sum of the second signal loss and the additional signal loss is approximately the same as the first signal loss.

In some aspects, the techniques described herein relate to the first trace having a first length, the second trace has a second length, the first length being larger than the second length, and a sum of the second signal loss and the additional signal loss is substantially the same as the first signal loss.

In some aspects, the techniques described herein relate to the first signal at the second end having a first strength, the second signal at the fourth end has a second strength, and the second strength is the substantially same as the first strength.

In some aspects, the techniques described herein relate to the layer having a first portion made of a first material having a first dissipation factor and a second portion made of a second material having a second dissipation factor, and the second dissipation factor is different than the first dissipation factor.

In some aspects, the techniques described herein relate to the layer having a third portion made of the first material, and the first portion, the second portion, and the third portion are arranged as stripes across the layer.

In some aspects, the techniques described herein relate to the layer including a plurality of indicators, each of the plurality of indicators is associated with one of the stripes, and each of the plurality of indicators indicates properties of the material of its associated stripe.

In some aspects, the techniques described herein relate to the layer having a third portion made of the first material, and a fourth portion made of the second material, and the first portion, the second portion, the third portion, and the fourth portion are arranged in a checkerboard pattern.

In some aspects, the techniques described herein relate to each of the first portion and the second portion being formed of a mixture of glass and a resin, the first material is a first resin, the second material is a second resin, and the second resin is different than the first resin.

In some aspects, the techniques described herein relate to the layer having a first portion made of a first material having a first dissipation factor and a second portion made of a second material having a second dissipation factor different than the first dissipation factor, the first trace being in contact with the first portion, the second trace being in contact with the second portion, and a strength of the first signal at the second end is substantially the same as a strength of the second signal at the fourth end.

In some aspects, the techniques described herein relate to the first trace having a first length, the second trace has a second length, and the second length is different than the first length.

In some aspects, the techniques described herein relate to a printed circuit board, comprising: a layer having a first portion and a second portion, the first portion being formed of a first material, the second portion being formed of a second material, the second material having different dissipation properties from the first material; a first trace coupled to the layer and carrying a first signal, the first trace having a first end and a second end opposite the first end, the first trace being proximate to the first material and having a first length; and a second trace coupled to the layer and carrying a second signal, the second trace having a third end and a fourth end opposite the third end, the second trace being proximate to the second material and having a second length, the second length being greater than the first length, wherein the first material induces a first signal loss in the first trace, the second material induces a second signal loss in the second trace, and the first material and the second material create signal losses in the first trace and in the second trace respectively such that signal losses in the first trace and in the second trace are substantially the same.

In some aspects, the techniques described herein relate to a printed circuit board, further comprising: a chip; a first panel port; and a second panel port, wherein the first end of the first trace is connected to the chip, the second end of the first trace is connected to the first panel port, the third end of the second trace is connected to the chip, and the fourth end of the second trace is connected to the second panel port, the first signal at the second end has a first strength, the second signal at the fourth end has a second strength, and the second strength is substantially the same as the first strength.

In some aspects, the techniques described herein relate to the first material having a first dissipation factor and the second material has a second dissipation factor, the second dissipation factor being different than the first dissipation factor.

In some aspects, the techniques described herein relate to the layer having a third portion made of the first material, the first portion, the second portion, and the third portion are arranged as stripes across the layer, the layer includes a plurality of indicators, each of the plurality of indicators is associated with one of the stripes, and each of the plurality of indicators indicates properties of the material of its associated stripe.

In some aspects, the techniques described herein relate to the layer having a third portion being formed of a third material, the third material having different dissipation properties from the first material and the second material, and at least one of the first portion, the second portion or the third portion includes an indicator associated therewith that denotes one of the portions of the layer.

In some aspects, the techniques described herein relate to the first trace being in contact with the first portion, the second trace is in contact with the second portion, and a strength of the first signal at the second end is substantially the same as a strength of the second signal at the fourth end.

In some aspects, the techniques described herein relate to a printed circuit board, comprising: a layer having a loss balancing feature, the loss balancing feature including a first portion of the layer being formed of a first resin material having first dissipation properties and a second portion of the layer being formed of a second resin material having second dissipation properties, the second dissipation properties being different from the first dissipation properties; a first trace coupled to the layer and in contact with the first portion, the first trace having a first length and extending from a first end to a second end, the first trace carrying a first signal that has a first strength at the first end and a second strength at the second end; and a second trace coupled to the layer and in contact with the second portion, the second trace having a second length and extending from a third end to a fourth end, the second trace carrying a second signal that has a third strength at the third end and a fourth strength at the fourth end, wherein the second length is greater than the first length, the first strength is substantially the same as the third strength, and the second strength is substantially the same as the fourth strength due to the loss balancing feature of the layer causing a signal loss in the first trace to be substantially the same as a signal loss in the second trace.

In some aspects, the techniques described herein relate to the loss balancing feature including a third portion being formed of a third resin material having third dissipation properties, the third dissipation properties being different from the first and second dissipation properties, and at least one of the first portion, the second portion or the third portion includes an indicator associated therewith that that denotes one of the portions of the loss balancing feature.

Variations and Implementations

Note that in this Specification, references to various features (e.g., elements, structures, nodes, modules, components, engines, logic, steps, operations, functions, characteristics, etc.) included in "one embodiment," "example embodiment," "an embodiment," "another embodiment," "certain embodiments," "some embodiments," "various embodiments," "other embodiments," "alternative embodiment," and the like are intended to mean that any such features are included in one or more embodiments of the present disclosure, but may or may not necessarily be combined in the same embodiments.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase "at least one of," "one or more of," "and/or," variations thereof, or the like are open-ended expressions that are both conjunctive and disjunctive in operation for any and all possible combination of the associated listed items. For example, each of the expressions "at least one of X, Y and Z," "at least one of X, Y or Z," "one or more of X, Y and Z," "one or more of X, Y or Z" and "X, Y and/or Z" can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms "first," "second," "third," etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, "first X" and "second X" are intended to designate two "X" elements that are not necessarily limited by any order, rank, importance, temporal sequence, or hierarchy of the two elements. Further as referred to herein, "at least one of" and "one or more of" can be represented using the "(s)" nomenclature (e.g., one or more element(s)).

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. A printed circuit board, comprising:

a layer;

a first trace coupled to the layer and carrying a first signal, the first trace having a first end and a second end opposite the first end, the first signal in the first trace encountering a first signal loss between the first end and the second end;

a second trace coupled to the layer and carrying a second signal, the second trace having a third end and a fourth end opposite the third end, the second signal in the second trace encountering a second signal loss between the third end and the fourth end; and a loss introducing feature that creates an additional signal loss in one of the first trace or the second trace, a sum of the additional signal loss and the one of the first trace or the second trace is approximately the same as the other of the first trace or the second trace, wherein the additional signal loss balances the first signal loss and the second signal loss.

2. The printed circuit board of claim 1, further comprising:

a chip;

a first panel port; and a second panel port, wherein the first end of the first trace is connected to the chip, the second end of the first trace is connected to the first panel port, the third end of the second trace is connected to the chip, and the fourth end of the second trace is connected to the second panel port.

3. The printed circuit board of claim 2, wherein the additional signal loss is created in the second trace.

4. The printed circuit board of claim 1, wherein the first trace has a first length, the second trace has a second length, the first length being larger than the second length, and a sum of the second signal loss and the additional signal loss is substantially the same as the first signal loss.

5. The printed circuit board of claim 1, wherein the first signal at the second end has a first strength, the second signal at the fourth end has a second strength, and the second strength is substantially the same as the first strength.

6. The printed circuit board of claim 1, wherein the layer has a first portion made of a first material having a first dissipation factor and a second portion made of a second material having a second dissipation factor, and the second dissipation factor is different than the first dissipation factor.

7. The printed circuit board of claim 6, wherein the layer has a third portion made of the first material, and the first portion, the second portion, and the third portion are arranged as stripes across the layer.

8. The printed circuit board of claim 7, wherein the layer includes a plurality of indicators, each of the plurality of indicators is associated with one of the stripes, and each of the plurality of indicators indicates properties of a material of its associated stripe.

9. The printed circuit board of claim 6, wherein the layer has a third portion made of the first material, and a fourth portion made of the second material, and the first portion, the second portion, the third portion, and the fourth portion are arranged in a checkerboard pattern.

10. The printed circuit board of claim 6, wherein each of the first portion and the second portion is formed of a mixture of glass and a resin, the first material is a first resin, the second material is a second resin, and the second resin is different than the first resin.

11. The printed circuit board of claim 1, wherein the layer has a first portion made of a first material having a first dissipation factor and a second portion made of a second material having a second dissipation factor different than the first dissipation factor, the first trace being in contact with the first portion, the second trace being in contact with the second portion, and a strength of the first signal at the second end is substantially the same as a strength of the second signal at the fourth end.

12. The printed circuit board of claim 11, wherein the first trace has a first length, the second trace has a second length, and the second length is different than the first length.

13. A printed circuit board, comprising:

a layer having a first portion and a second portion, the first portion being formed of a first material, the second portion being formed of a second material, the second material having different dissipation properties from the first material;

a first trace coupled to the layer and carrying a first signal, the first trace having a first end and a second end opposite the first end, the first trace being proximate to the first material and having a first length; and a second trace coupled to the layer and carrying a second signal, the second trace having a third end and a fourth end opposite the third end, the second trace being proximate to the second material and having a second length, the second length being greater than the first length, wherein the first material induces a first signal loss in the first trace, the second material induces a second signal loss in the second trace, and the first material and the second material create signal losses in the first trace and in the second trace respectively such that signal losses in the first trace and in the second trace are substantially the same.

14. The printed circuit board of claim 13, further comprising:

a chip;

a first panel port; and a second panel port, wherein the first end of the first trace is connected to the chip, the second end of the first trace is connected to the first panel port, the third end of the second trace is connected to the chip, and the fourth end of the second trace is connected to the second panel port, the first signal at the second end has a first strength, the second signal at the fourth end has a second strength, and the second strength is substantially the same as the first strength.

15. The printed circuit board of claim 13, wherein the first material has a first dissipation factor and the second material has a second dissipation factor, the second dissipation factor being different than the first dissipation factor.

16. The printed circuit board of claim 15, wherein the layer has a third portion made of the first material, the first portion, the second portion, and the third portion are arranged as stripes across the layer, the layer includes a plurality of indicators, each of the plurality of indicators is associated with one of the stripes, and each of the plurality of indicators indicates properties of a material of its associated stripe.

17. The printed circuit board of claim 13, wherein the layer has a third portion being formed of a third material, the third material having different dissipation properties from the first material and the second material, and at least one of the first portion, the second portion or the third portion includes an indicator associated therewith that denotes one of the portions of the layer.

18. The printed circuit board of claim 13, wherein the first trace is in contact with the first portion, the second trace is in contact with the second portion, and a strength of the first signal at the second end is substantially the same as a strength of the second signal at the fourth end.

19. A printed circuit board, comprising:

a layer having a loss balancing feature, the loss balancing feature including a first portion of the layer being formed of a first resin material having first dissipation properties and a second portion of the layer being formed of a second resin material having second dissipation properties, the second dissipation properties being different from the first dissipation properties;

a first trace coupled to the layer and in contact with the first portion, the first trace having a first length and extending from a first end to a second end, the first trace carrying a first signal that has a first strength at the first end and a second strength at the second end; and a second trace coupled to the layer and in contact with the second portion, the second trace having a second length and extending from a third end to a fourth end, the second trace carrying a second signal that has a third strength at the third end and a fourth strength at the fourth end, wherein the second length is greater than the first length, the first strength is substantially the same as the third strength, and the second strength is substantially the same as the fourth strength due to the loss balancing feature of the layer causing a signal loss in the first trace to be substantially the same as a signal loss in the second trace.

20. The printed circuit board of claim 19, wherein the loss balancing feature includes a third portion being formed of a third resin material having third dissipation properties, the third dissipation properties being different from the first and second dissipation properties, and at least one of the first portion, the second portion or the third portion includes an indicator associated therewith that that denotes one of the portions of the loss balancing feature.

\* \* \* \* \*